United States Patent
Wang et al.

(10) Patent No.: US 8,408,747 B2
(45) Date of Patent: Apr. 2, 2013

(54) LIGHT EMITTING DEVICES HAVING HEAT-DISSIPATING SURFACE

(75) Inventors: Kung-Hsia Wang, Taipei (TW); Ra-Min Tain, Zhonghe (TW); Ping-Hsin Hsia, Hsinchu (TW); Hsien-Chang Lee, Daxi Township, Taoyuan County (TW); Shu-Jung Yang, Guiren Township, Tainan County (TW); Chao-Hsien Chang, Zhonghe (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 267 days.

(21) Appl. No.: 12/575,317

(22) Filed: Oct. 7, 2009

(65) Prior Publication Data

US 2010/0085754 A1    Apr. 8, 2010

Related U.S. Application Data

(60) Provisional application No. 61/103,698, filed on Oct. 8, 2008.

(51) Int. Cl.
    *F21V 29/00* (2006.01)
(52) U.S. Cl. .................................. 362/294; 362/373
(58) Field of Classification Search .................. 362/294, 362/373, 249.02, 800
    See application file for complete search history.

(56) References Cited

U.S. PATENT DOCUMENTS

| | | | |
|---|---|---|---|
| 6,598,996 B1 * | 7/2003 | Lodhie | 362/249.05 |
| 7,396,142 B2 * | 7/2008 | Laizure et al. | 362/240 |

(Continued)

FOREIGN PATENT DOCUMENTS

| | | |
|---|---|---|
| CN | 1608326 A | 4/2005 |
| CN | 201096280 Y | 8/2008 |

(Continued)

OTHER PUBLICATIONS

Notification of Reasons for Refusal, issued by the Japanese Patent Office, dated Oct. 18, 2011, in a Japanese patent application No. 2009-233743 (3 pages).

(Continued)

*Primary Examiner* — Peggy A. Neils
(74) *Attorney, Agent, or Firm* — Finnegan, Henderson, Farabow, Garrett & Dunner, LLP

(57) ABSTRACT

A light-emitting device may include a heat-dissipating base, a light-emitting unit, a housing, and a first conductive contact and a second conductive contact. The heat-dissipating base has a top portion and a bottom portion. The bottom portion of the heat-dissipating base may include an exposed heat-dissipation surface. The light-emitting unit is over the top portion of the heat-dissipating base and is arranged to provide heat conductivity at least from the light-emitting unit to the heat-dissipating base. The light-emitting unit may include at least one light-emitting diode for emitting light and a first electrode and a second electrode. Heat may be generated as the light-emitting diode emits light, and the at least one light-emitting diode may have power input terminals for receiving power input to the at least one light-emitting diode. The power input may include one of an alternating-current input and a direct-current input. The first electrode and the second electrode are electrically coupled with the input terminals of the at least one light-emitting diode. The housing encloses at least a portion of the light emitting unit and covers the top portion of the heat-dissipating base. The first conductive contact and the second conductive contact are near or below a portion of the heat-dissipating base and are configured to receive external power supply. The first conductive contact may be electrically coupled with the first electrode, and the second conductive contact may be electrically coupled with the second electrode.

25 Claims, 10 Drawing Sheets

U.S. PATENT DOCUMENTS

| | | | |
|---|---|---|---|
| 7,543,961 B2 * | 6/2009 | Arik et al. | 362/294 |
| 7,575,339 B2 * | 8/2009 | Hung | 362/230 |
| 7,637,643 B2 * | 12/2009 | Maxik | 362/373 |
| 7,654,699 B2 * | 2/2010 | Chang et al. | 362/294 |
| 7,758,223 B2 * | 7/2010 | Osawa et al. | 362/547 |
| 7,976,182 B2 * | 7/2011 | Ribarich | 362/221 |
| 7,976,335 B2 * | 7/2011 | Weber et al. | 439/487 |
| 8,123,381 B1 * | 2/2012 | Wray | 362/294 |
| 8,143,769 B2 * | 3/2012 | Li | 313/46 |
| 8,246,202 B2 * | 8/2012 | Mart et al. | 362/249.02 |
| 2006/0050514 A1 * | 3/2006 | Opolka | 362/294 |
| 2006/0181416 A1 | 8/2006 | Chen | |
| 2008/0211421 A1 | 9/2008 | Lee et al. | |
| 2010/0264799 A1 * | 10/2010 | Liu et al. | 313/46 |
| 2011/0128742 A9 * | 6/2011 | Yuen et al. | 362/294 |

FOREIGN PATENT DOCUMENTS

| | | |
|---|---|---|
| JP | 2006-310057 | 11/2006 |
| JP | 2006-313718 | 11/2006 |
| TW | M283957 | 12/2005 |
| TW | M335627 | 7/2008 |

OTHER PUBLICATIONS

First Office Action, issued by Chinese Patent Office, dated Jan. 26, 2011, in Chinese patent application No. 200910205839.8 (7 pages).

Second Office Action, issued by Chinese Patent Office, dated Dec. 12, 2011, in Chinese patent application No. 200910205839.8 (6 pages).

* cited by examiner

LIGHT EMITTING DEVICES HAVING HEAT-DISSIPATING SURFACE

PRIORITY

This application claims the benefit of priority of U.S. Provisional Application No. 61/103,698, filed Oct. 8, 2008, and titled "LED BULB", the entire contents of which are incorporated herein by reference.

TECHNICAL FIELD

The present disclosure relates generally to light-emitting devices and, more particularly, to light-emitting devices having a heat-dissipating surface.

BACKGROUND

Lighting has been an essential aspect of modern civilization. FIG. 1 illustrates an example of a conventional light bulb. Referring to FIG. 1, light bulb 10 may include housing 12, base 14, and filament 16. Light bulb emits light by heating lighting filament 16 to a very high temperature. However, the majority of the energy may be consumed in generating heat rather than emitting light.

Various forms and technologies of lighting have been developed to provide various functions and uses. Additionally, due to the limited supply of energy, there is increasing global consciousness for providing greener or more energy-efficient sources of lighting. Light sources can be greener at their fabrication processes because the processes may consume less energy or material during fabrication. Light sources can also be greener when being operated because they may consume less energy. Light sources can also be greener at their end of life because their disposal may result in less impact to the environment or because some of their components may be easily recycled.

Due to the popularity of traditional light bulbs and standardized socket designs for accepting those light bulbs, the majority of current lighting systems use one of the standardized socket designs and therefore continue to demand the use of traditional light bulbs. In many uses, there is benefits in avoiding the need of replacing existing lighting systems while using newer or more energy-efficient light sources. Providing interchangeability with traditional bulbs or compatibility with traditional lighting systems may allow the transition into the use of modern lighting technologies without the need to replace existing lighting systems.

Heat generation of light sources may depend on the type of technologies used. In some lighting systems or devices, providing adequate heat dissipation may remain one of the design considerations. For example, adequate heat dissipation may be among the factors for providing safe, efficient, and/or reliable lighting products.

Therefore, it may be desirable in some embodiments to have light-emitting devices offering ease of interchangeability with traditional light bulbs, offering heat-dissipation capabilities, or offering design or operational characteristics that may offer one or more improvement over traditional light bulbs.

SUMMARY

In one exemplary embodiment, the present disclosure is directed to a light-emitting device. The light-emitting device may include a heat-dissipating base, a light-emitting unit, a housing, a first conductive contact, and a second conductive contact. The heat-dissipating base has a top portion and a bottom portion. The bottom portion of the heat-dissipating base may include an exposed heat-dissipation surface. The light-emitting unit is over the top portion of the heat-dissipating base and is arranged to provide heat conductivity at least from the light-emitting unit to the heat-dissipating base. The light-emitting unit may include at least one light-emitting diode for emitting light and a first electrode and a second electrode. Heat may be generated as the light-emitting diode emits light, and the at least one light-emitting diode may have power input terminals for receiving power input to the at least one light-emitting diode. The power input may include one of an alternating-current input and a direct-current input. The first electrode and the second electrode are electrically coupled with the input terminals of the at least one light-emitting diode. The housing encloses at least a portion of the light emitting unit and covers at least the top portion of the heat-dissipating base. The first conductive contact and the second conductive contact may be located near or below the heat-dissipating base and are configured to receive external power supply. The first conductive contact may be electrically coupled with the first electrode, and the second conductive contact may be electrically coupled with the second electrode.

In another exemplary embodiment, the present disclosure is directed to another light-emitting device. The light-emitting device may include a heat-dissipating base, a light-emitting unit, a housing, a first conductive contact, a second conductive contact, and a contact base. The heat-dissipating base has a top portion and a bottom portion. The bottom portion of the heat-dissipating base may include an exposed heat-dissipation surface. The light-emitting unit is over the top portion of the heat-dissipating base and is arranged to provide heat conductivity at least from the light-emitting unit to the heat-dissipating base. The light-emitting unit may include at least one light-emitting diode for emitting light and a first electrode and a second electrode. Heat may be generated as the light-emitting diode emits light. The at least one light-emitting diode may have power input terminals for receiving power input to the at least one light-emitting diode. The power input may include one of an alternating-current input and a direct-current input. The first electrode and the second electrode are electrically coupled with the input terminals of the at least one light-emitting diode. The housing encloses at least a portion of the light emitting unit and covers at least the top portion of the heat-dissipating base. The first conductive contact and the second conductive contact are configured to receive external power supply. The first conductive contact may be electrically coupled with the first electrode, and the second conductive contact may be electrically coupled with the second electrode. The contact base may be below the bottom portion of the heat-dissipating base and may have at least two conductive contacts. The conductive contacts may include a circumferential conductive contact and tip conductive contact, with the tip conductive contact being configured to serve as the first conductive contact and being insulated from the circumferential conductive contact and the circumferential conductive contact being configured to serve as the second conductive contact.

DETAILED DESCRIPTION

The disclosed embodiments provide light-emitting devices having a heat-dissipating structure that may be integrated as part of the device. Depending on the uses or designs, the light-emitting devices may further include a contact base that may be compatible with one of the standardized light-bulb sockets. Compatibility with existing sockets may allow interchangeability with traditional light bulbs and may provide users with the benefits of replacing the light bulbs with light-emitting devices that may be more reliable, may have a longer life span, may generate less heat, may offer different colors (or color temperatures), or may improve energy efficiency.

As examples of an energy-efficient light sources, solid-state (or also known as semiconductor) light sources such as light-emitting diodes (LEDs) can provide brightness (or luminance), sometimes with less heat generated. Among LED-based devices, devices that may be driven directly by alternating current (AC) power sources may be suitable in various home, office, and industrial uses. In some embodiments, the small size of solid-state light sources may provide design flexibility, such as various design arrangements with different numbers of LEDs arranged in rows, rings, clusters, or specific patters. Solid-state light sources may also offer long life spans (long lamp life). Consistent with the disclosed embodiments, the heat-dissipating structure of the light-emitting device may provide heat dissipation for LEDs, which may offer safety, reliability, or applicability of light-emitting devices for various uses.

Figure 1:
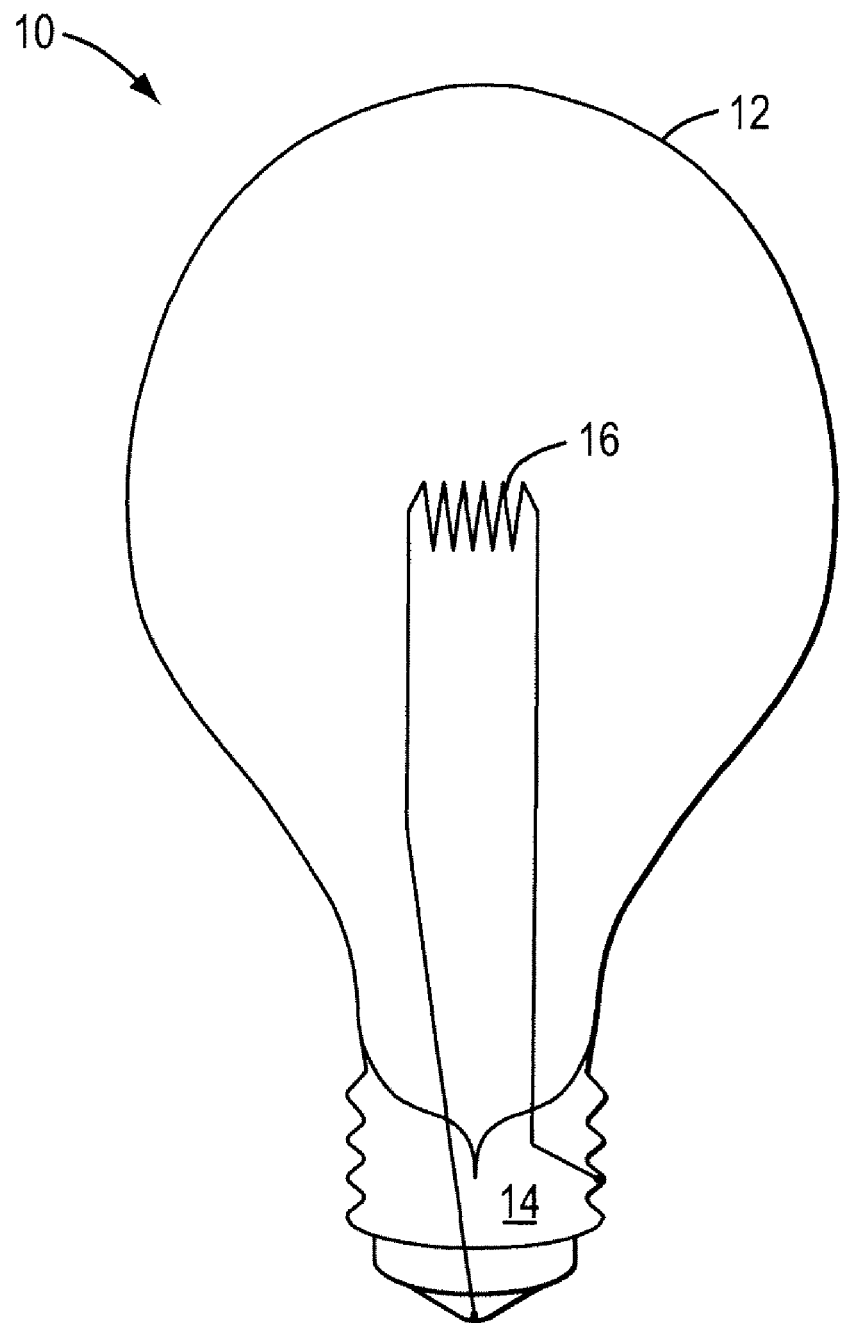
FIG. 1 illustrates an example of a traditional light bulb in the prior art.
Figure 2A:
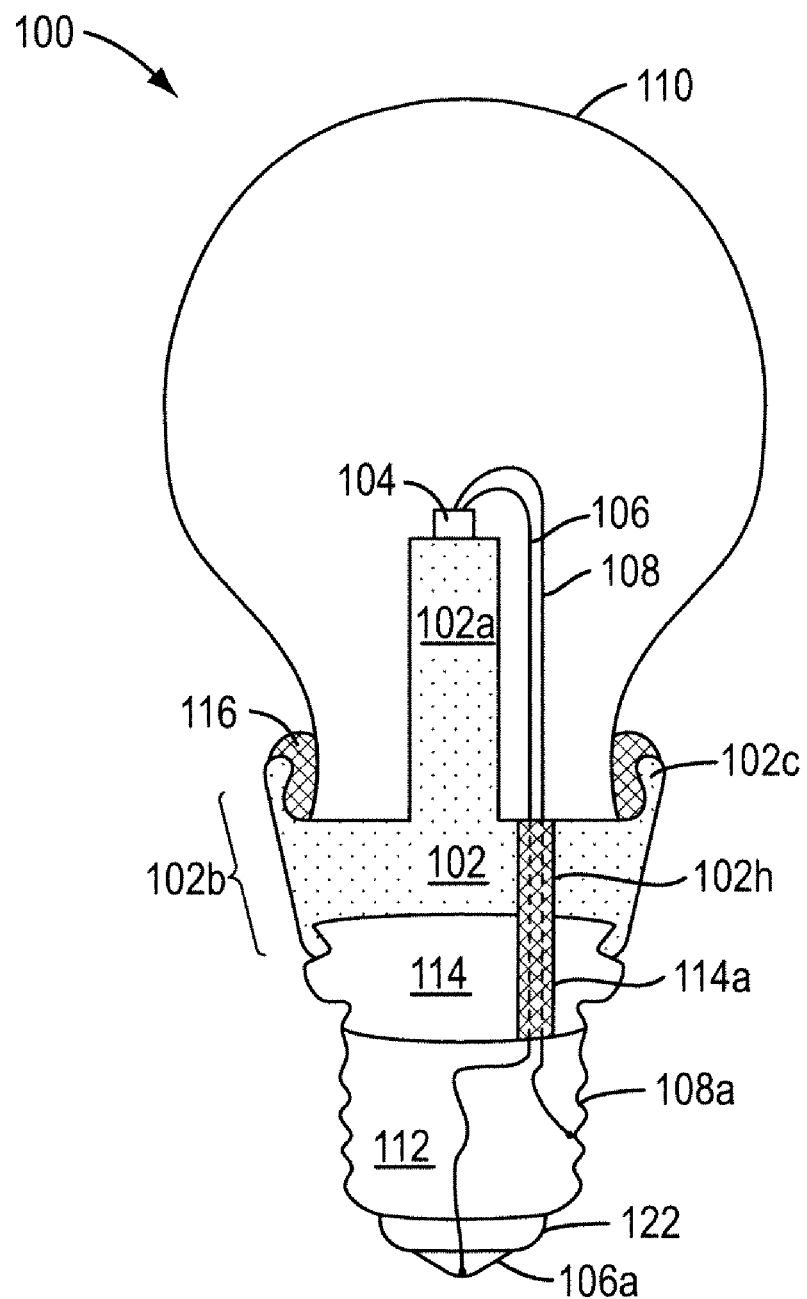
FIG. 2a illustrates an exemplary light-emitting device consistent with the disclosed embodiments.

FIG. 2a illustrates an exemplary light-emitting device consistent with the disclosed embodiments. Referring to FIG. 2a, light-emitting device 100 may include heat-dissipating base 102, light-emitting unit 104, first electrode 106, second electrode 108, and housing 110. Heat-dissipating base 102 may include top portion 102a and bottom portion 102b. Bottom portion 102b may include an exposed heat-dissipation surface, such as the surface illustrated in FIG. 2a.

Figure 3:
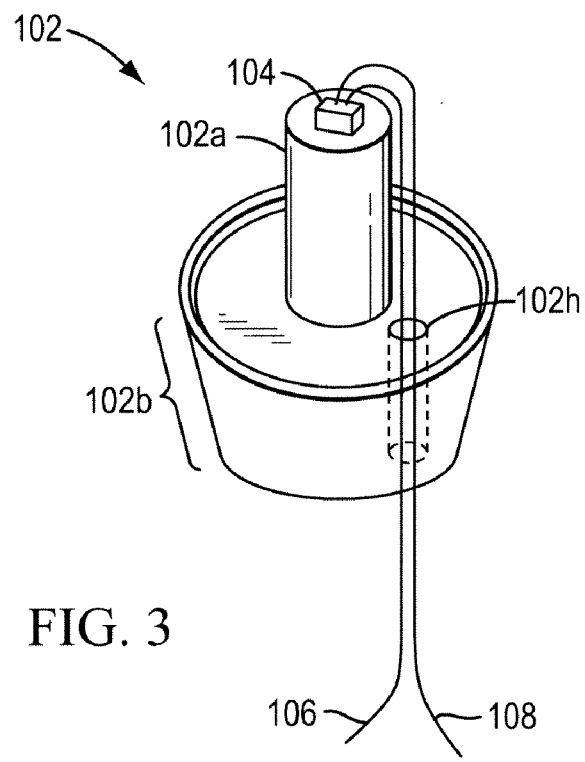
FIG. 3 illustrates an example of a heat-dissipating base consistent with the disclosed embodiments.

FIG. 3 illustrates an exemplary configuration of heat dissipating base 102. In one embodiment, top portion 102a may be an upward protrusion extended from the lower part of heat-dissipating base 102 and may provide a top surface for mounting light-emitting unit 104. In another embodiment, the upward protrusion may raise the position of light-emitting unit 104 and may be varied to adjust the center of light-emitting device, which may be used to create the appearance or design similar to standardized light bulbs. In some embodiments, heat-dissipating base 102 may include a conductive material for providing electrical conductivity or may include a material with good heat conductivity to dissipate heat quickly. As an example, aluminum, aluminum-containing alloy, copper-containing alloy, and other alloy or metal may be used in heat-dissipating base 102 to provide heat conductivity.

Referring again to FIG. 2a, light-emitting unit 104 may be over top portion 102a of heat-dissipating base 102 and may be mounted to top portion 102a. The direct or indirect contact between light-emitting unit 104 and heat-dissipating base 102b is configured to provide heat conductivity, which may be bi-directional or at least from light-emitting unit 104 to heat-dissipating base 102. In the disclosed embodiments, heat conductivity may refer to the capability of a material or structure to serve as a medium for the transfer of heat from one point to another. Light-emitting unit 104 may be a solid-state (or semiconductor) light-emitting device in some embodiments. In one embodiment, light-emitting unit 104 may include one or more light-emitting diodes (not shown) for emitting light, which may generate heat as part of their light-emitting mechanism or process. The light-emitting diodes may have power input terminals for receiving power input to the light-emitting diodes. In one embodiment, the power input terminals may be provided on the surface of light-emitting unit 104, as illustrated in FIG. 3 FIG. 3 shows that electrodes 106 and 108 are coupled to light-emitting unit 104 at the top of light-emitting unit 104, which may provide power input terminals, such as input contact pads, pins, or leads (not shown in the drawing). Depending on the design, configuration, or use, the power input may be an alternating-current (AC) input or a direct-current (DC) input. In some embodiments, the light-emitting diodes may be (or be part of) a light-emitting diode assembly designed for alternating-current (AC), direct current (DC), or both AC and DC uses. In one embodiment, the assembly may have a number of light-emitting diodes arranged in a bridge-rectifier circuit or two or more bridge-rectifier circuits. In one embodiment, there may be four arms or branches to a bridge-rectifier circuit and each arm or branch may have one or more light-emitting diodes. In other words, the use of the light-emitting diodes as the rectifying diodes themselves may remove the need for an external rectifying circuit when AC power is applied to light-emitting device 100. In some embodiments, the light-emitting diodes may be (or be part of) a DC light-emitting diode assembly. The DC light-emitting diode assembly may be coupled with one or more bridge-rectifier circuits. In one embodiment, the DC light-emitting diode assembly itself does not need to provide rectifying function and may receive DC power directly or may receive AC power through the use of the bridge-rectifier circuit(s). The bridge-rectifier(s) may use other components, such as diodes, and may be placed outside or within light-emitting device 100, such as within heat-dissipating base 102, as part of light-emitting unit 104, or within housing 110.

Referring to FIG. 2a, first electrode 106 and second electrode 108 may be electrically (conductively) coupled with the input terminals of the light-emitting diodes. In one embodiment, first electrode 106 and second electrode 108 may be conductive leads or wires, and one or both of them may have protective or insulative covering. Referring to FIG. 3, in some embodiments, first electrode 106 and second electrode 108 may pass through a portion of heat-dissipating base 102, which may provide one or more through holes. In some embodiments, one or more portions of heat-dissipating base 102 may offer internal conductive (electrically conductive) path(s), which may serve as portions of first electrode 106, second electrode 108, or both. When portion(s) of heat-dissipating base 102 serve as conductive path(s), certain protection or insulation may be added to avoid leakage or reduce safety concerns.

Referring to FIG. 2a, housing 110 may enclose at least a portion of light-emitting unit 104 and may cover a portion of heat-dissipating base 102, such as top portion 102a. In one embodiment, housing 110 may enclose light-emitting unit 104 and the top portion of first and conductive electrodes 106 and 108 within the housing. In one embodiment, housing 110 may be mounted to a portion of heat-dissipating base 102. In some embodiments, housing 110 may include a material that is fully or partially transparent, either with or without coloring or light-diffusing effects. In some embodiments, housing 110 may be a sealed housing, which may prevent undesirable effects caused by dust or moisture on light-emitting device 100.

Figure 2B:
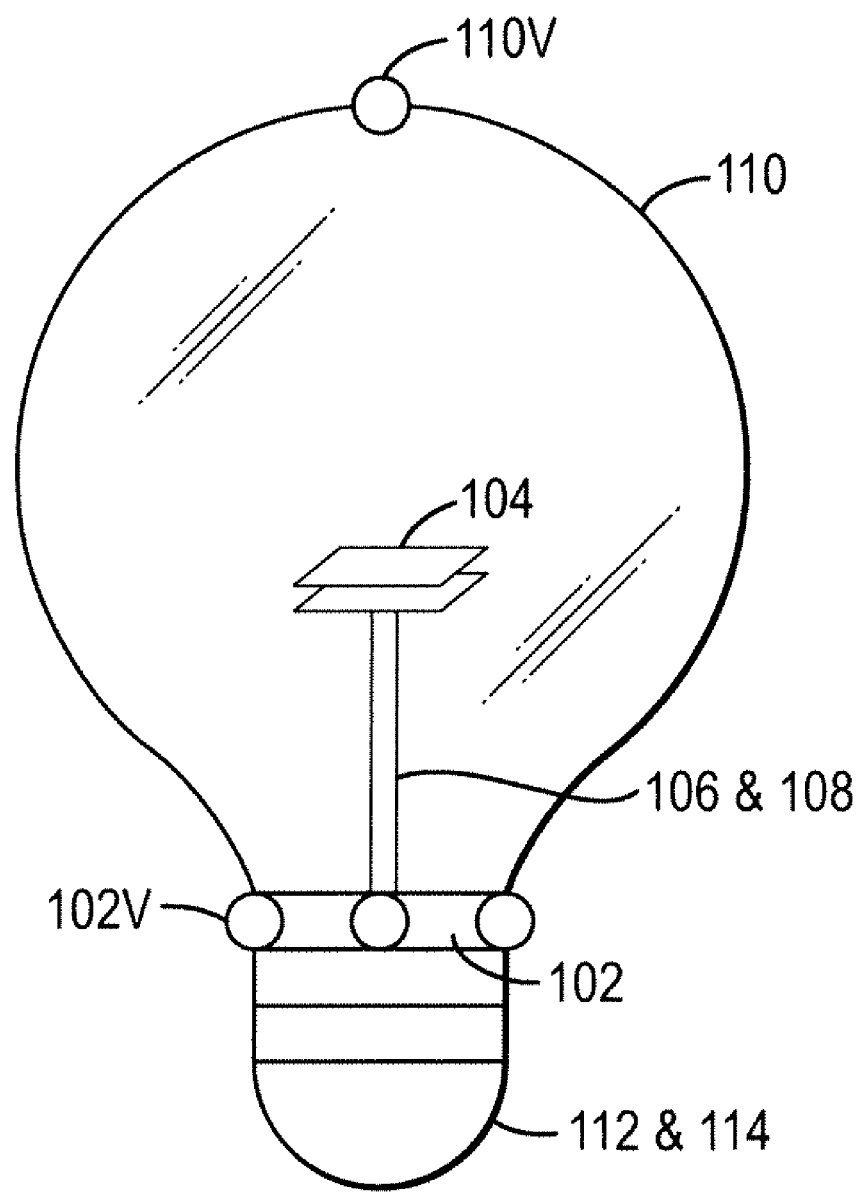
FIG. 2b illustrates an example of having a ventilated housing consistent with certain disclosed embodiments.

In some other embodiments, housing 110 may be a ventilated housing, which may include two or more openings in housing 110 or in heat-dissipating base 102 for ventilation. An example of a ventilated housing is shown in FIG. 2b, which illustrates an example of having a ventilated housing consistent with certain disclosed embodiments. As shown in FIG. 2b, Housing 110 may have a ventilating hole 110v. Heat-dissipating base 102 may have one or more ventilating holes, such as ventilating holes 102v. The ventilating holes may allow air to flow into and through the space within housing 110 to dissipate part of the heat generated by light-emitting unit 104. In other embodiments, housing 110 may be provided with multiple ventilating holes at various locations.

Figure 2C:
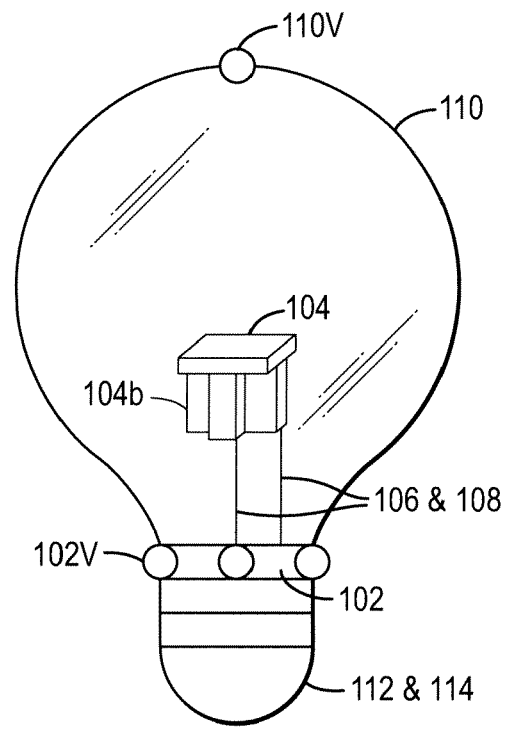
FIGS. 2c-2g illustrate examples of heat-dissipating or strength re-enforcement designs consistent with the disclosed embodiments.
Figure 2D:
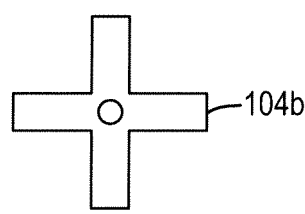
Figure 2F:
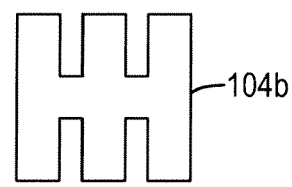
Figure 2E:
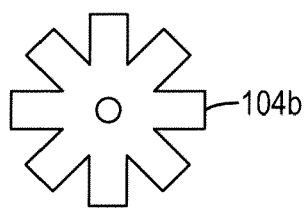
Figure 2G:
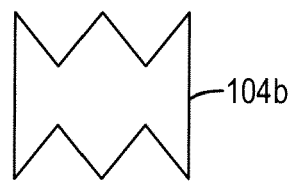

One or both of heat-dissipating base 102 and light-emitting unit 104 may be provided with certain heat-dissipating or a strength-re-enforcement design. FIGS. 2c-2g illustrate examples of heat-dissipating or strength-re-enforcement designs consistent with the disclosed embodiments. Referring to FIG. 2c, light-emitting unit 104 may have a base portion 104b that is attached to the light source area of light-emitting unit 104 to facilitate the dissipation of heat generated by light-emitting unit 104. Alternatively, base portion 104b may extend vertically and may be part of heat-dissipating base 102 (rather than light-emitting unit 104). FIGS. 2d-2g illustrate examples of the shape design of base portion 104b, such as a cross design with four fins and a multiple-fin design having six or eight rectangular or triangular fins.

Returning to FIG. 2a, in some embodiments, light-emitting device 100 may include first conductive contact 106a and second conductive contact 108a that are near or below (or attached to a portion of) heat-dissipating base 102. First conductive contact 106a may be electrically coupled with first electrode 106, and second conductive contact 108a may be electrically coupled with second electrode 108. In one embodiment, insulator 122 may be sandwiched between first conductive contact 106a and second conductive contact 108a and insulate one from the other.

In some embodiments, light-emitting device 100 may further include contact base 112 (also known as lamp base), which may be below bottom portion 102b of heat-dissipating base 102. Contact base 112 may have two or more conductive contacts and may include, in one embodiment, a conductive contact tip, which may serve as first conductive contact 106a, and a circumferential conductive contact, which may serve as second conductive contact 108a. In one embodiment, the conductive contact tip may be electrically coupled with first electrode 106 and be insulated from the circumferential conductive contact. And the circumferential conductive contact may be electrically coupled with second electrode 108. In one embodiment, when contact base 112 is used, first conductive contact 106a and second conductive contact 108a illustrated above (which were part of heat-dissipating base 102) may be incorporated into contact base 112 with insulator 122 sandwiched between first conductive contact 106a and second conductive contact 108a. Additionally, light-emitting device 100 may further include insulator 114 between heat-dissipating base 102 and contact base 112, and the insulator may be mounted to or attached to bottom portion 102b of heat-dissipating base 102. In one embodiment, insulator 114 may provide thermal insulation, electrical insulation, or both between heat-dissipating base 102 and contact base 112. In one embodiment, through hole 114a may be provided within insulator 114 for first and second electrodes 106 and 108 to make contacts with contact base 112.

In some embodiments, contact base 112 may include a contact (or lamp base) design compatible with one of standard light-bulb contact designs to provide the interchangeability of light-emitting devices 100 with one or more of the standardized light bulbs. Referring to FIG. 2a, contact base 112 may provide a standardized "screw base", which may have one center contact and a circumferential contact surrounding the upper rim (or portions of it) of the base shell. And the base shells may be made of conductive materials such as copper, aluminum, or an alloy. Examples of "screw base" designs may include candelabra base (E12), intermediate base (E17), medium base (E26), Mogul base (E39), Bayonet base, etc. Alternatively, contact base 112 may be designed to provide pin-based contacts, such as a 2 pin, 3 pin, or 4 pin design that sometimes are used for halogen lamps or other types of bulbs or lamps.

As illustrated above, light-emitting device 100 may include various necessary or optional parts such as heat-dissipating base 102, light-emitting unit 104, first electrode 106, second electrode 108, housing 110, first conductive contact 106a, second conductive contact 108a, contact base 112, and insulator 114. In joining two parts of light-emitting device 100 or sealing the gaps between two parts, a sealing material may be used. In embodiments where electrical insulation is required, a sealing material such as silicon or silicon-based sealant (or adhesive) may be used.

As an example, as shown in FIG. 2a, heat-dissipating base 102 may have a surrounding, internal wall 102c that is attached to or near the "neck" or the lower part of housing 110. In some embodiments, sealing material 116, such as silicon-based adhesive, may be used for binding or sealing the space between the two parts. In one embodiment, the sealing material 116 may be filled in the space between the two and may provide an air-tight or water-tight sealing in some embodiments to prevent dust or moisture from entering into housing 110 and affect the reliability of light-emitting unit 104. In another embodiment, sealing material may also fill the through holes 102h (if they are provided) in heat-dissipating base 102, insulator 114, or both.

Figure 4:
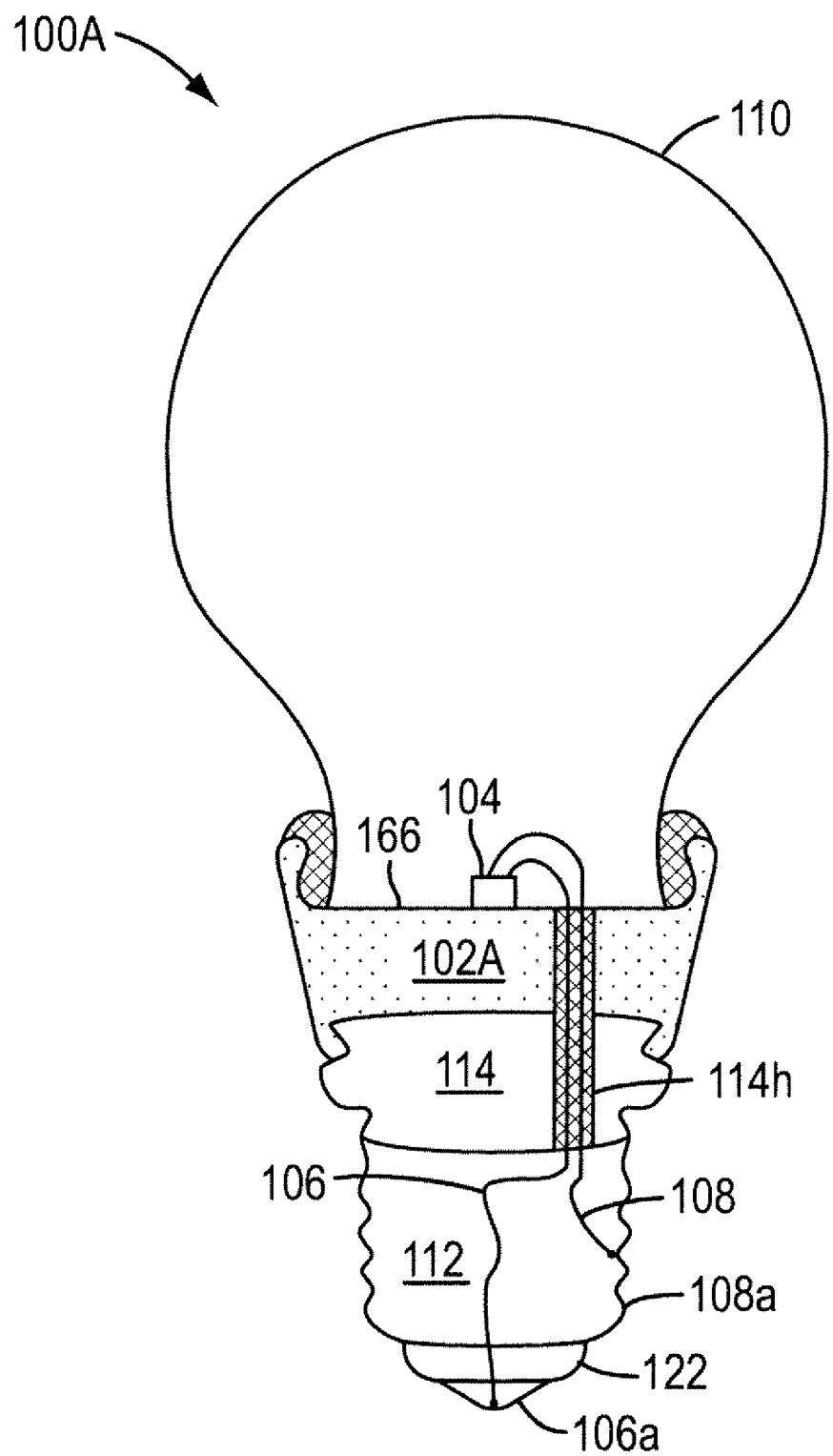
FIG. 4 illustrates another example of a light-emitting device consistent with the disclosed embodiments.

FIG. 4 shows another example of a light-emitting device consistent with the disclosed embodiments. Light-emitting device 100A in FIG. 4 may differ from light-emitting device 100 in FIG. 2a in that heat-dissipating device 102A does not include an upward protrusion (top portion 102a). Heat-dissipating base 102A in FIG. 4 may have its top portion provide surface 166 for mounting light-emitting device 104. Other parts of light-emitting device 100A in FIG. 4 may be the same as or similar to the components used in light-emitting 100 in FIG. 2a.

Figure 5:
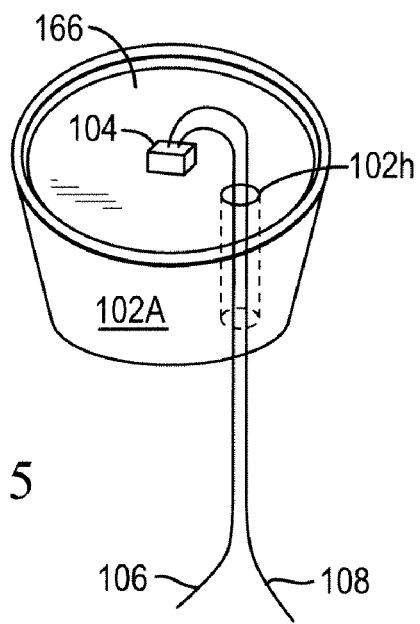
FIG. 5 illustrates an exemplary heat-dissipating base consistent with the disclosed embodiments.

FIG. 5 illustrates an exemplary heat-dissipating base consistent with the disclosed embodiments. In one embodiment, heat-dissipating base 102 may be used in light-emitting device 100A in FIG. 4 and may provide a flat top surface 166 for mounting light emitting unit 104. Heat-dissipating base 102A may provide through hole 102h for allowing electrodes 106 and 108 to pass through the heat-dissipating base 102A.

Figure 6:
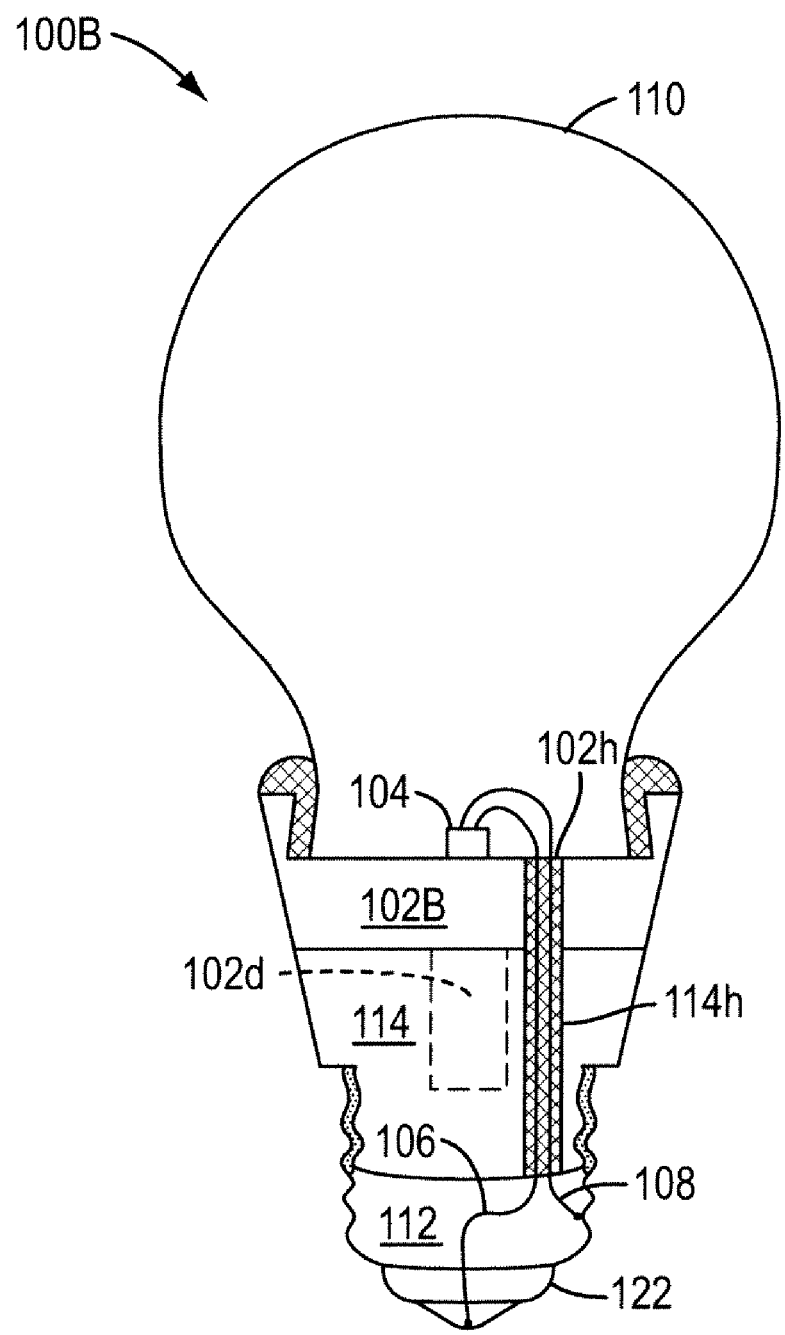
FIG. 6 illustrates another exemplary design of a light-emitting device consistent with the disclosed embodiments.

FIG. 6 illustrates another exemplary design of a light-emitting device consistent with the disclosed embodiments. Light-emitting device 100B in FIG. 6 may differ from light-emitting device 100 in FIG. 2a in that heat-dissipating device 102B may include downward protrusion 102d extending downward from the lower portion of heat-dissipating device 102B, such as illustrated in FIG. 6. In some embodiments, downward protrusion 102d may be provided to facilitate the assembly or manufacturing of light-emitting device 100B. For example, insulator 114 may have a corresponding cup hole for fitting downward protrusion 102d into the cup hole. Insulator 114 may also include a through hole 114h to allow two or more electrodes to go thorough insulator 114. In some embodiments, the design may offer exchangeability of the upper section of light-emitting device 100B and may allow the replacement of heat-dissipating base 102B, light-emitting unit 104, first electrode 106, second electrode 108, and housing 110 without replacing contact base 112 and insulator 114. In some embodiments, conductive contact points may be provided between the two groups of components to offer exchangeability. The cup hole and downward protrusion 102d may be designed to be attached with or without the use of adhesive or sealant.

Figure 7:
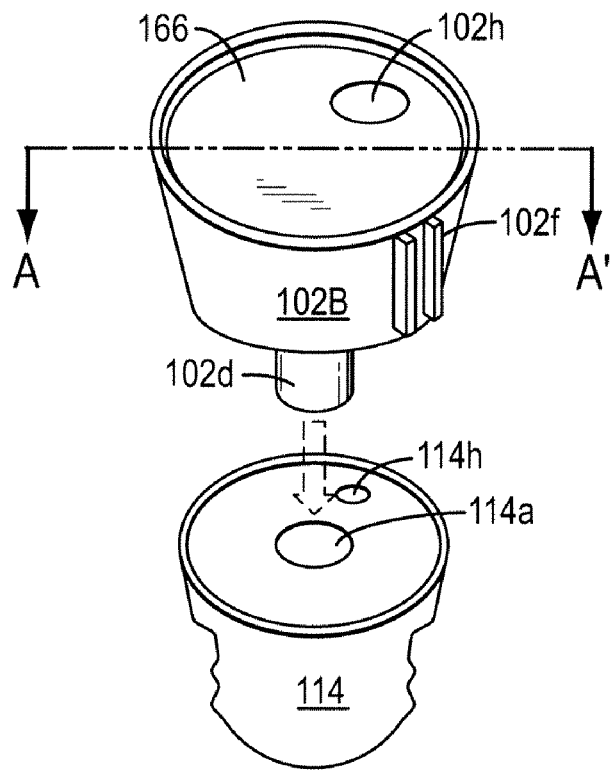
FIG. 7 illustrates an example of a heat-dissipating base and an insulator consistent with the disclosed embodiments.

FIG. 7 illustrates an example of a heat-dissipating base and an insulator consistent with the disclosed embodiments. Referring to FIG. 7, heat-dissipating base 102B and insulator 114 as illustrated may be used in light-emitting device 100B illustrated in FIG. 6. Heat-dissipating base 102B may have its top portion provide surface 166 for mounting light-emitting device 104. Downward protrusion 102d may extend from heat-dissipating base 102B and to fit into cup hole 114a. Although insulator 114 may provide through hole 114h to allow two or more electrodes to go thorough insulator 114, downward protrusion 102d and cup hole 114a may be designed to provide two or more contact points, such as conductive contact pads or matching pin-and-pin-receiver pairs to remove the need of separate wirings or leads. FIG. 7 also illustrates an exemplary design of providing heat-dissipating fins 102f on a portion of heat-dissipating base 102B. Although FIG. 7 only illustrates two vertically-extended fins, the number, shape, dimension, and configuration of heat-dissipating fins may vary in different embodiments.

Figure 8:
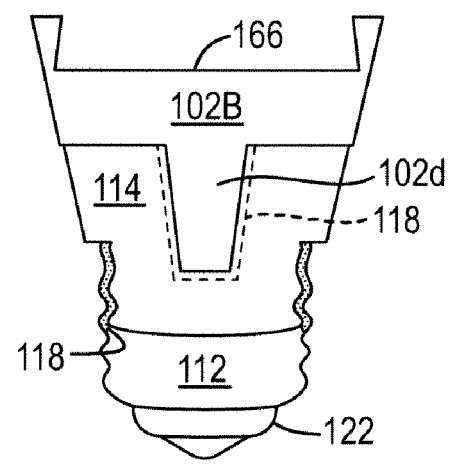
FIG. 8 illustrates a cross-sectional view of a heat-dissipating base, an insulator, and a contact base along cross-sectional line A-A' in FIG. 7, consistent with the disclosed embodiments.

To illustrate a further example of the structures in FIG. 7, FIG. 8 illustrates a cross-sectional view of a heat-dissipating base, an insulator, and a contact base along cross-sectional line A-A' in FIG. 7, consistent with the disclosed embodiments. In some embodiments, heat-dissipating base 102B and insulator 114 may be attached to each other by having a tight fit between downward protrusion 102d and cup hole 114a or by adhesive or sealant. For example, in one embodiment, sealing material 118 may fill the space between the downward protrusion 102d and cup hole 114a. In other embodiments, no sealant or adhesive is necessary.

Figure 9:
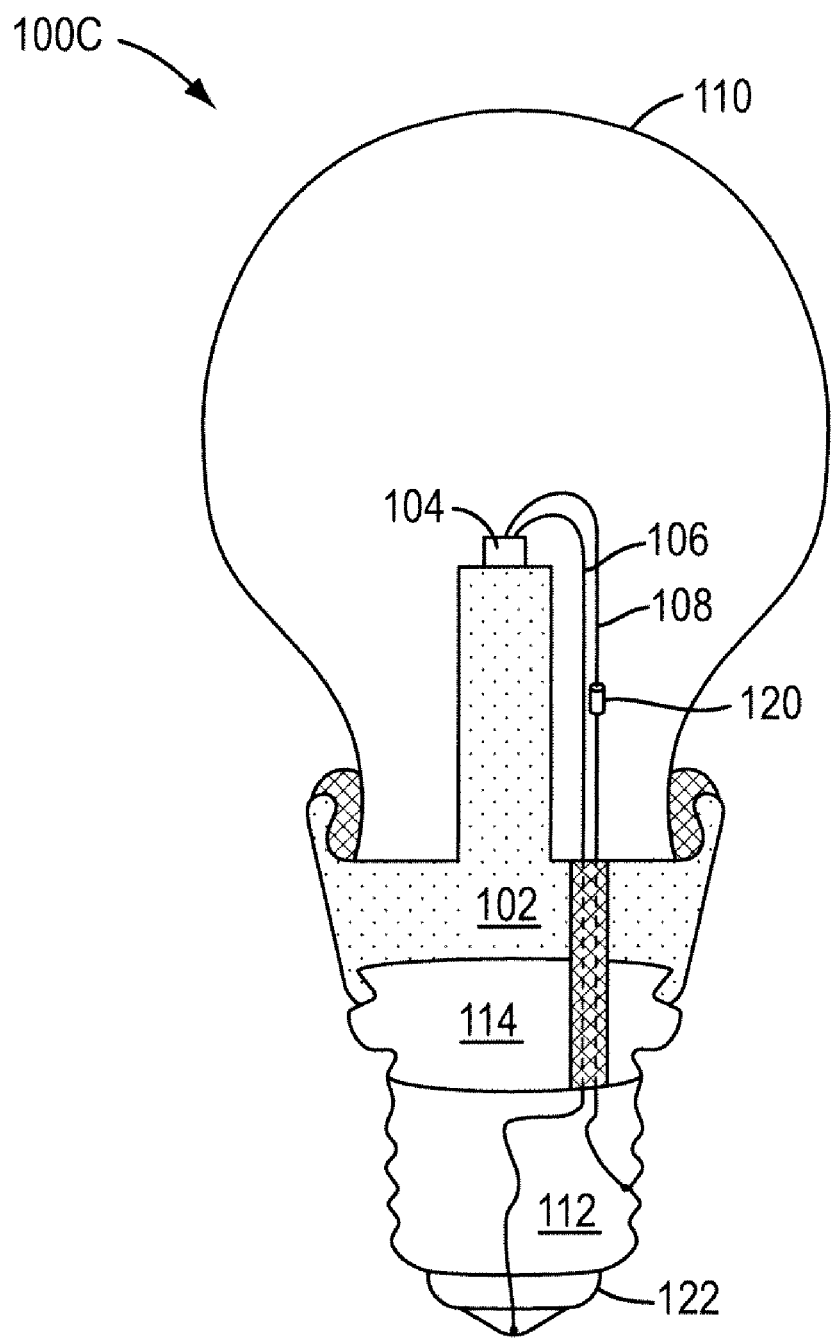
FIG. 9 illustrates another exemplary design of a light-emitting device consistent with the disclosed embodiments.
Figure 10:
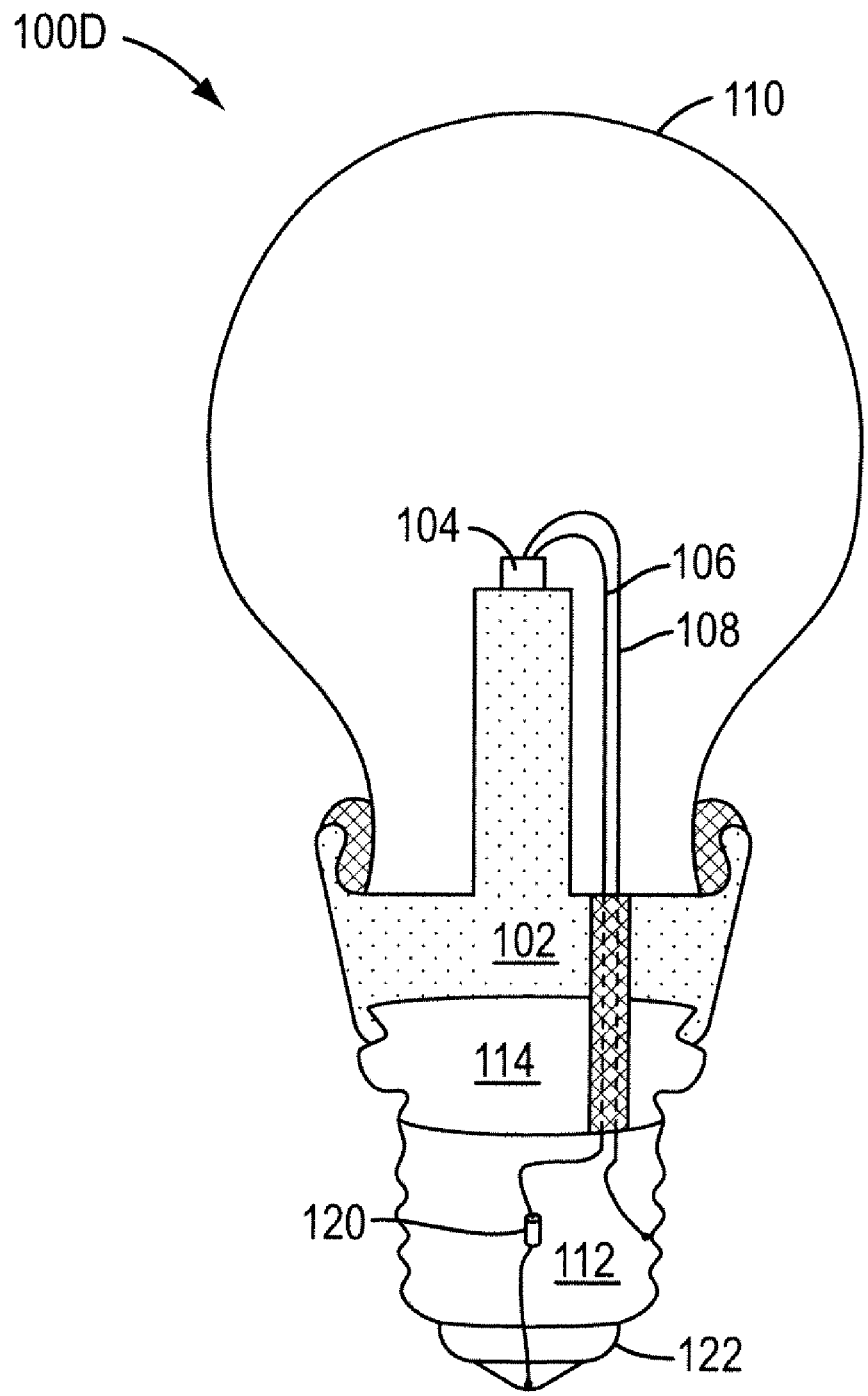
FIG. 10 illustrates an example of placing a power-surge suppressor in a contact base consistent with the disclosed embodiments.

FIG. 9 illustrates another exemplary design of a light-emitting device consistent with the disclosed embodiments. Referring to FIG. 9, light-emitting device 100C may include power-surge suppressor 120, which may be electrically coupled with one of first and second electrodes 106 and 108. In one embodiment, power-surge suppressor 120 may be serially coupled with second electrode 108 and may provide part of the conductive path. In some embodiments, power-surge suppressor 120 may be a resistor or a varistor and may be placed anywhere between the power supply and the light-emitting diodes of light-emitting device 104, such as in housing 110, within heat-dissipating base 102, in insulator 114, or in contact base 112. FIG. 10 illustrates an example of placing power-surge suppressor 120 in contact base 112 and serially-coupling power-surge suppressor 120 along the conductive path of first electrode 106.

It will be apparent to those skilled in the art that various modifications and variations can be made to the disclosed embodiments of light-emitting devices. It is intended that the specification and examples be considered as exemplary only, with a true scope of the disclosure being indicated by the following claims and their equivalents.

What is claimed is:

1. A light-emitting device comprising:
a heat-dissipating base having a solid structure and including a top portion and a bottom portion, the bottom portion of the heat-dissipating base comprising an exposed heat-dissipation surface;
a light-emitting unit over the top portion of the heat-dissipating base so as to provide heat conductivity at least from the light-emitting unit to the heat-dissipating base, the light-emitting unit comprising:
at least one light-emitting diode for emitting light, with heat being generated as the at least one light-emitting diode emits light, the at least one light-emitting diode having power input terminals for receiving power input to the at least one light-emitting diode, the power input comprising one of an alternating-current input and a direct-current input; and
a first electrode and a second electrode, the first electrode and the second electrode being electrically coupled with the input terminals of the at least one light-emitting diode;
a housing enclosing at least a portion of the light-emitting unit, the housing covering at least the top portion of the heat-dissipating base; and
a first conductive contact and a second conductive contact, the first conductive contact and the second conductive contact being configured to receive an external power supply, the first conductive contact being electrically coupled with the first electrode and the second conductive contact being electrically coupled with the second electrode, the first conductive contact and the second conductive contact being disposed at a location near or below a portion of the heat-dissipating base,
wherein the heat-dissipating base has a ventilating hole connecting a space inside the housing and an outside space to allow air from the outside space into the space inside the housing to reach and dissipate heat generated by the light-emitting unit.

2. The light-emitting device of claim 1, further comprising:
a contact base below the bottom portion of the heat-dissipating base, the contact base configured to include the first and second conductive contacts, the first conductive contact being a tip conductive contact, and the second conductive contact a circumferential conductive contact and insulated from the tip conductive contact; and
an insulator between the heat-dissipating base and the contact base, the insulator being mounted to the bottom portion of the heat-dissipating base.

3. The light-emitting device of claim 2, wherein the contact base comprises a contact design compatible with one of standard light-bulb contact designs to provide interchangeability of the light-emitting devices with at least one of light bulbs.

4. The light-emitting device of claim 1, wherein at least a portion of the heat-dissipating base comprises a conductive material.

5. The light-emitting device of claim 1, wherein the first and second electrodes comprise two conductive leads passing through at least a portion of the heat-dissipating base.

6. The light-emitting device of claim 1, wherein the housing comprises a material being at least partially transparent and comprises one of a sealed housing and a ventilated housing having at least two openings for ventilation.

7. The light-emitting device of claim 1, wherein the at least one light-emitting diode comprises part of an alternating-current light-emitting diode assembly having the at least one light-emitting diode arranged in a bridge-rectifier circuit.

8. The light-emitting device of claim 1, wherein the at least one light-emitting diode comprises part of a direct-current light-emitting diode assembly that is coupled with at least one bridge-rectifier circuit.

9. The light-emitting device of claim 1, wherein the top portion of the heat-dissipating base comprises an upward protrusion for mounting the light-emitting unit.

10. The light-emitting device of claim 1, further comprising a sealing material for sealing at least one gap within the light-emitting device.

11. The light-emitting device of claim 1, further comprising a power surge suppressor electrically coupled with at least one of the first and second electrodes.

12. A light-emitting device comprising:
a heat-dissipating base having a solid structure and including a top portion and a bottom portion, the bottom portion of the heat-dissipating base comprising an exposed heat-dissipation surface;
a light-emitting unit over the top portion of the heat-dissipating base so as to provide heat conductivity at least from the light-emitting unit to the heat-dissipating base, the light-emitting unit comprising:
  at least one light-emitting diode for emitting light, with heat being generated as the at least one light-emitting diode emits light, the at least one light-emitting diode having power input terminals for receiving power input to the at least one light-emitting diode, the power input comprising one of an alternating-current input and a direct-current input; and
  a first electrode and a second electrode, the first electrode and the second electrode being electrically coupled with the input terminals of the at least one light-emitting diode;
a housing enclosing at least a portion of the light emitting unit, the housing covering at least the top portion of the heat-dissipating base; and
a contact base below the bottom portion of the heat-dissipating base, the contact base comprising a circumferential conductive contact and tip conductive contact for receiving external power supply, the tip conductive contact being electrically coupled with the first electrode and being insulated from the circumferential conductive contact, and the circumferential conductive contact being electrically coupled with the second electrode,
wherein the heat-dissipating base has a ventilating hole connecting a space inside the housing and an outside space to allow air from the outside space into the space inside the housing to reach and dissipate heat generated by the light-emitting unit.

13. The light-emitting device of claim 12, further comprising an insulator between the heat-dissipating base and the contact base, the insulator being mounted to the bottom portion of the heat-dissipating base.

14. The light-emitting device of claim 12, wherein the contact base comprises a contact design compatible with one of standard light-bulb contact designs to provide the interchangeability of the light-emitting devices with at least one of light bulbs.

15. The light-emitting device of claim 12, wherein at least a portion of the heat-dissipating base comprises a conductive material.

16. The light-emitting device of claim 12, wherein the first and second electrodes comprise two conductive leads passing through at least a portion of the heat-dissipating base.

17. The light-emitting device of claim 12, wherein the housing comprises a material being at least partially transparent and comprises one of a sealed housing and a ventilated housing having at least two openings for ventilation.

18. The light-emitting device of claim 12, wherein the at least one light-emitting diode comprises part of an alternating-current light-emitting diode assembly having the at least one light-emitting diode arranged in a bridge-rectifier circuit.

19. The light-emitting device of claim 12, wherein the at least one light-emitting diode comprises part of a direct-current light-emitting diode assembly that is coupled with at least one bridge-rectifier circuit.

20. The light-emitting device of claim 12, wherein the top portion of the heat-dissipating base comprises an upward protrusion for mounting the light-emitting unit.

21. The light-emitting device of claim 12, further comprising a sealing material for sealing at least one gap within the light-emitting device.

22. The light-emitting device of claim 12, further comprising a power surge suppressor electrically coupled with at least one of the first and second electrodes.

23. The light-emitting device of claim 1, wherein the light-emitting unit is formed directly on the top portion of the heat-dissipating base.

24. The light-emitting device of claim 12, wherein the light-emitting unit is formed directly on the top portion of the heat-dissipating base.

25. The light-emitting device of claim 1, wherein the heat-dissipating base further includes an internal wall surrounding a lower part of the housing, the internal wall having a top point higher than an upper surface of the bottom portion and lower than an upper surface of the top portion.

* * * * *